United States Patent
Um

(10) Patent No.: US 8,030,597 B2
(45) Date of Patent: Oct. 4, 2011

(54) PARTITION-TYPE HEATING APPARATUS

(75) Inventor: Pyung-yong Um, Kyungki-do (KR)

(73) Assignee: Eugene Technology Co., Ltd., Cheonan (KR)

( * ) Notice: Subject to any disclaimer, the term of this patent is extended or adjusted under 35 U.S.C. 154(b) by 483 days.

(21) Appl. No.: 12/089,912

(22) PCT Filed: Oct. 11, 2006

(86) PCT No.: PCT/KR2006/004084
§ 371 (c)(1), (2), (4) Date: Apr. 8, 2009

(87) PCT Pub. No.: WO2007/043801
PCT Pub. Date: Apr. 19, 2007

(65) Prior Publication Data
US 2009/0218331 A1    Sep. 3, 2009

(30) Foreign Application Priority Data
Oct. 11, 2005  (KR) .......................... 10-2005-0095655

(51) Int. Cl.
*F23Q 7/22* (2006.01)
*C23C 16/00* (2006.01)

(52) U.S. Cl. ........................................ 219/267; 118/726
(58) Field of Classification Search .................. 219/267, 219/260, 261, 262, 263, 264, 265, 266, 268, 219/269, 270; 392/388, 389; 118/726
See application file for complete search history.

(56) References Cited

U.S. PATENT DOCUMENTS

| | | | | |
|---|---|---|---|---|
| 3,939,798 A | * | 2/1976 | Morton | 118/665 |
| 5,334,250 A | * | 8/1994 | Mikami et al. | 118/724 |
| 5,892,201 A | * | 4/1999 | Croucher et al. | 219/267 |
| 2002/0067917 A1 | * | 6/2002 | Takamatsu et al. | 392/388 |
| 2007/0101940 A1 | * | 5/2007 | Iizuka | 118/726 |
| 2009/0127244 A1 | * | 5/2009 | Russegger et al. | 219/267 |
| 2009/0218331 A1 | * | 9/2009 | Um | 219/267 |

* cited by examiner

*Primary Examiner* — Daniel L Robinson
(74) *Attorney, Agent, or Firm* — LRK Patent Law Firm

(57) ABSTRACT

A partition-type heating apparatus has advantageous effects in that a material to be heated, i.e., a reaction gas used in a chemical vapor deposition (CVD) process, is pre-heated and the pre-heated reaction gas flows through a flow channel defined by the vertical and horizontal partitions so that the flowing reaction gas is heated by the transfer of heat generated from a hot wire during the flow of the reaction gas, thereby securing heating performance required for a small-sized heating apparatus.

14 Claims, 5 Drawing Sheets

PARTITION-TYPE HEATING APPARATUS

CROSS-REFERENCES TO RELATED APPLICATIONS

This is a US national phase of International Application PCT/KR2006/004084, filed Oct. 11, 2006, and claims the benefit of priority of Republic of Korea Patent Application 10-2005-0095655, filed Oct. 11, 2005, both applications being incorporated by reference herein.

INTRODUCTION

The present discussion relates to a heater for heating a material to be heated (also referred to herein as a "to-be-heated material"), and more particularly, to a partition-type heating apparatus in which a reaction gas used as a to-be-heated material in a chemical vapor deposition (CVD) process flows through partitions each formed internally with a communicating hole so that the flowing reaction gas is heated by the transfer of heat generated from a hot wire to thereby increase a deposition efficiency.

BACKGROUND

In general, there is proposed a heating apparatus as shown in FIG. 1 for pre-heating a reaction gas in the CVD process. That is, the conventional heating apparatus includes a quarts tube 30 through which a reaction gas flows, a line heater 50 wound around the outer circumferential surface of the quarts tube 30, and ceramic balls 40 disposed inside the quarts tube 30.

In this case, the line heater 50 transfers heat to the ceramic balls 40 which in turn supplies the heat to the reaction gas for heating the reaction gas.

However, such a conventional heating apparatus as described above entails a demerit in that its volume increases, and it is difficult to extend the length of the quartz tube 30 and to have a large number of ceramic balls 40 disposed inside the quartz tube 30, which makes it difficult to sufficient heat the reaction gas flowing inside the quartz tube 30.

SUMMARY

Accordingly, in order to solve the above problems occurring in the related art, it is an object of the present discussion to provide a partition-type heating apparatus in which a reaction gas used as a to-be-heated material in a chemical vapor deposition (CVD) process flows through a partition formed internally with a flow hole so that the flowing reaction gas is heated by the transfer of heat generated from a hot wire to thereby increase a deposition efficiency.

The above object is accomplished by a partition-type heating apparatus comprising a heating unit for transferring heat generated from a hot wire to a to-be-heated material, wherein the heating unit includes: a heat transfer portion 120 having a cylindrical body, a plurality of vertical partitions arranged inside the cylindrical body in such a fashion as to be vertically spaced apart from one another at regular intervals, and horizontal partitions arranged inside the cylindrical body in such a fashion as to be transversely disposed between the vertical partitions, wherein each of the vertical partitions is formed with a communicating hole for allowing the to-be-heated material to flow therethrough and each of the horizontal partitions is formed with a communicating hole; a cylindrical inflow part mounted at one side of the body for introducing the to-be-heated material into the heating unit therethrough; and a cylindrical outflow part mounted at an opposite side to the inflow part for discharging the reaction gas to the outside therethrough.

As described above, the partition-type heating apparatus has advantageous effects in that a to-be-heated material, i.e., a reaction gas used in a chemical vapor deposition (CVD) process is pre-heated and the pre-heated reaction gas flows through a flow channel defined by the vertical and horizontal partitions so that the flowing reaction gas is heated by the transfer of heat generated from a hot wire during the flow of the reaction gas, thereby securing heating performance required for a small-sized heating apparatus.

DETAILED DESCRIPTION

Figure 1:
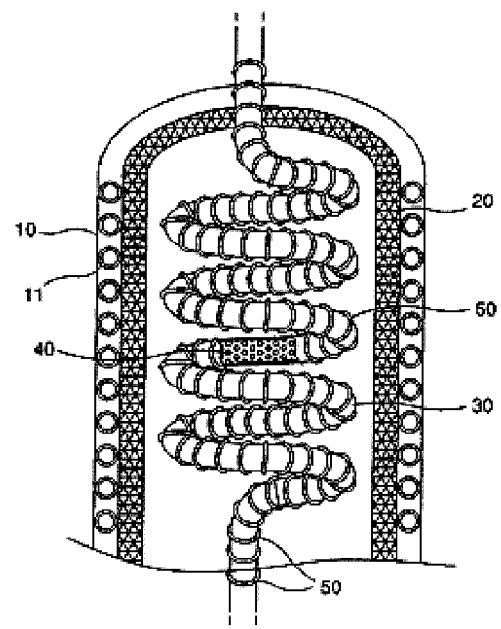
FIG. 1 is a conceptual view illustrating a conventional heating apparatus.

Hereinafter, example embodiments will be described in detail with reference to the accompanying drawings.

The partition-type heating apparatus according to the present discussion is intended to pre-heat a to-be-heated material, i.e., a reaction gas used in a chemical vapor deposition (CVD) process so as to flow the pre-heated reaction gas through partitions so that the flowing reaction gas is heated by the transfer of heat generated from a hot wire during the flow of the reaction gas.

The partition-type heating apparatus according to the present discussion includes a heating unit 100 for generating heat to transfer the heat to a reaction gas, an accommodating portion 200 for receiving the heating unit 100, a controller 300 connected to the heating unit 100 for controlling the temperature of the heating unit 100, and a power supply portion 400 connected to the accommodating portion 210 for supplying electric power to the heating unit 100.

The accommodating portion 200 is formed of a hollow cylindrical body 210 and the heating unit 100 is disposed inside the accommodating portion 200. A heat insulating material 230 is filled in a space defined between the accommodating portion 200 and the heating unit 100 so as to prevent the heat generated from the heating unit 100 from being discharged to the outside. In addition, the hollow cylindrical body 210 of the accommodating portion 200 is provided at a peripheral portion thereof having a certain thickness with a cooling water tube 220 for allowing cooling water to flow therethrough so as to prevent the overheat of the accommodating portion 200. The hollow cylindrical body 210 is provided at the upper and lower sides thereof with the controller 300 for controlling the temperature of the heating unit 100 and the power supply portion 400 for supplying electric power to the heating unit 100, respectively.

Figure 2:
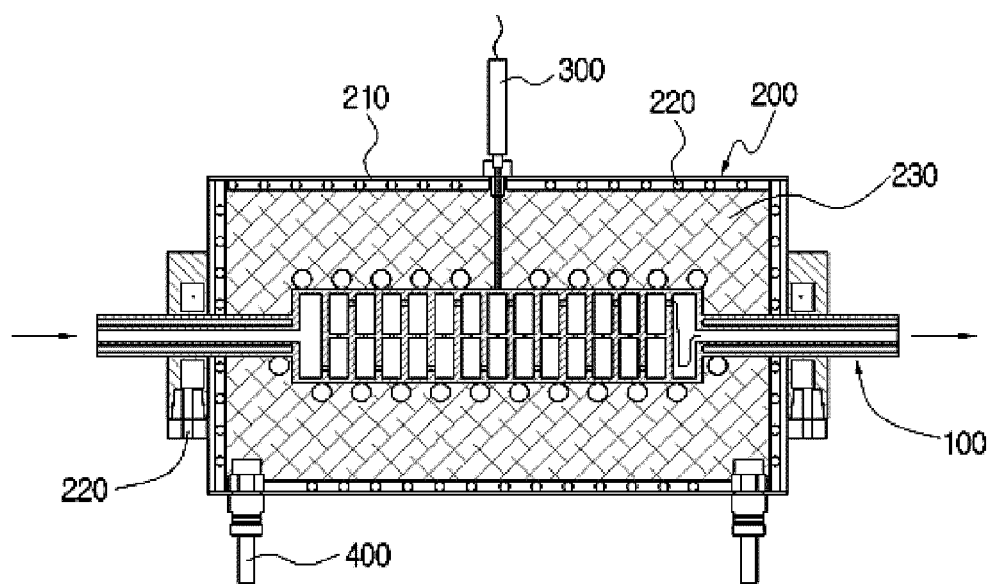
FIGS. 2 to 5 are conceptual views illustrating a heating apparatus according to the present discussion.
Figure 3:
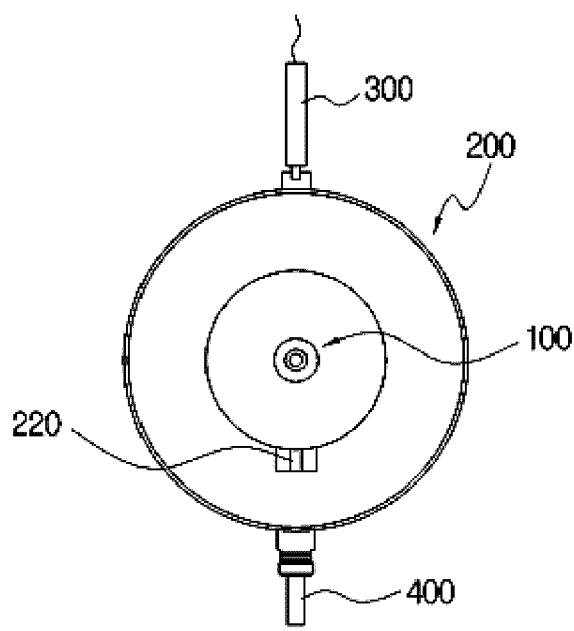
Figure 4:
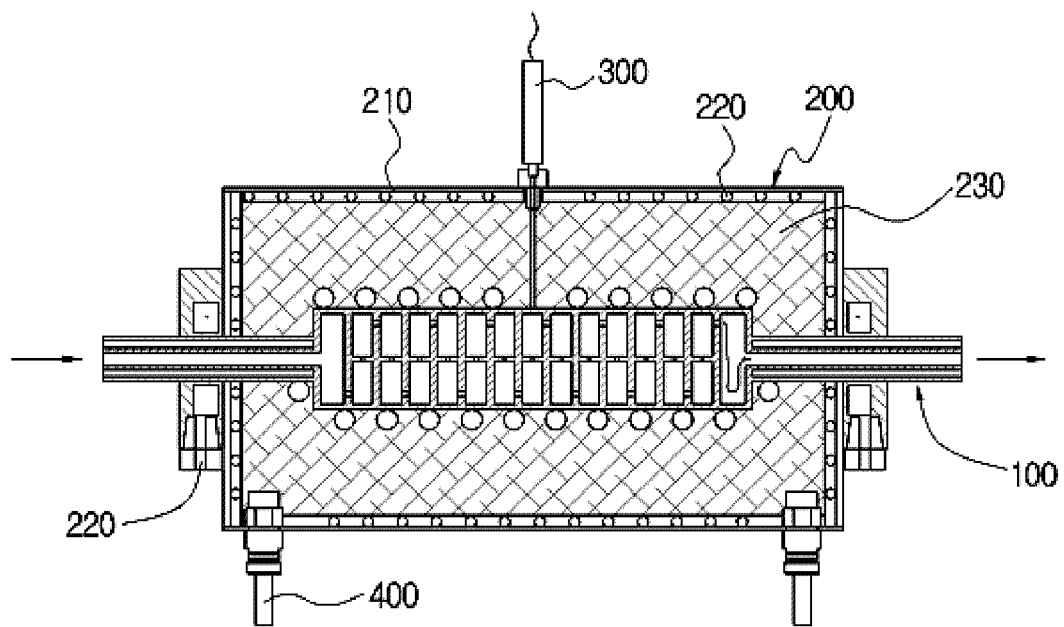
Figure 5:
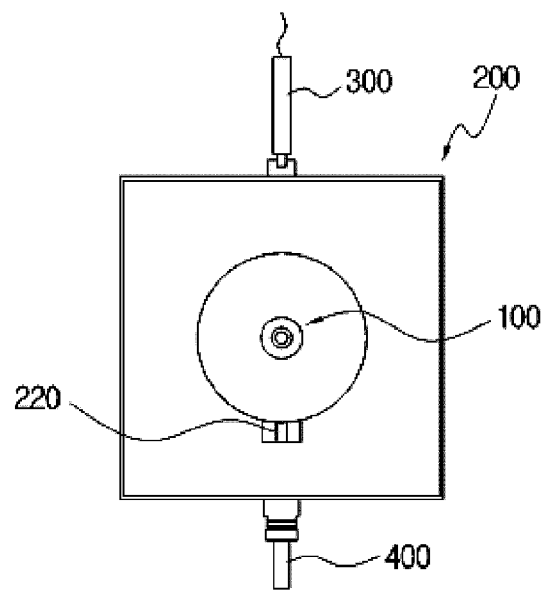

In the meantime, the body 210 of the accommodating portion 200 is formed in a hollow cylindrical shape as shown in FIGS. 2 and 3, but may be formed in a quadrangular shape as shown in FIGS. 4 and 5.

Figure 6:
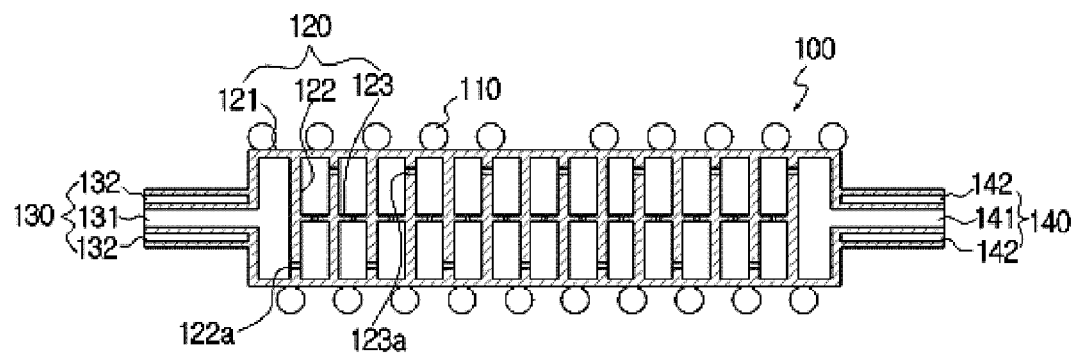
FIGS. 6 and 7 are a cross-sectional view and a perspective view, respectively, illustrating a heating unit of the heating apparatus according to the present discussion.
Figure 7:
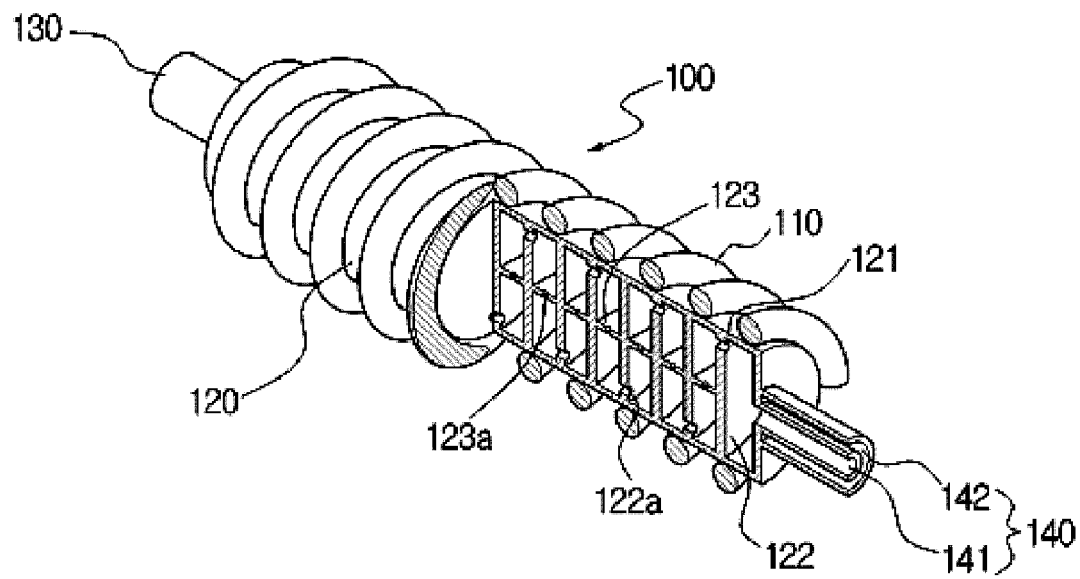

The heating unit 100 will be described hereinafter with reference to FIGS. 6 and 7.

Referring to the drawings, the heating unit 100 is composed of a hot wire 110 for receiving electric power to generate heat, a heat transfer portion 120 for transferring the heat generated from the hot wire 110 to a reaction gas, an inflow part 130 for introducing the reaction gas into the heating unit 100 therethrough and an outflow part 140 for discharging the reaction gas to the outside therethrough.

The heat transfer portion 120 consists of a cylindrical body 121, vertical partitions 122 arranged inside the cylindrical body 121 in such a fashion as to be vertically spaced apart from one another at regular intervals, and horizontal partitions 123 arranged inside the cylindrical body 121 in such a fashion as to be transversely disposed between the vertical partitions 122. Each of the vertical partitions 122 is formed in a disc shape and is formed with a communicating hole 122 for allowing the reaction gas to flow therethrough. Each of the horizontal partitions 123 is also formed with a communicating hole 126. The reaction gas is supplied with the heat generated from the hot wire 110 while passing through the communicating holes 122 and 126 in the respective partitions.

Figure 8:
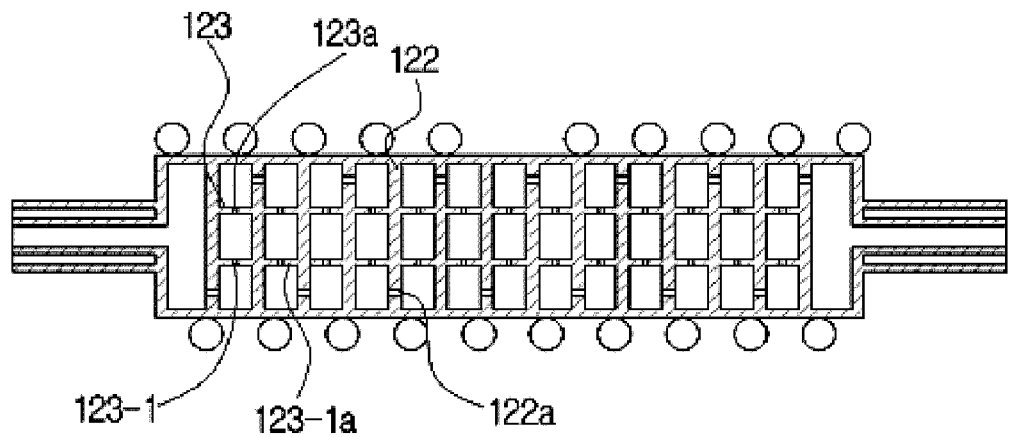
FIGS. 8 and 9 are cross-sectional view and a perspective view illustrating a heating unit of the heating apparatus according to another embodiment of the present discussion.
Figure 9:
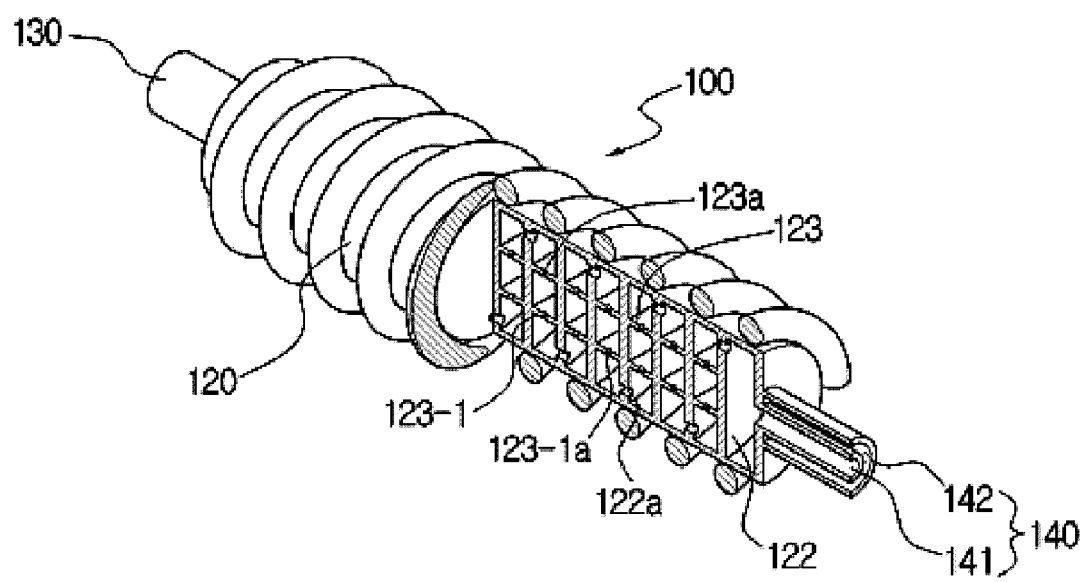

As shown in FIG. 8, additional horizontal partitions 123-1 are preferably arranged in the heating unit 100. That is, the addition of the horizontal partitions 123-1 increases the time required for the reaction gas to flow inside the heating unit 100 to thereby improve a heating effect.

In the meantime, the cylindrical body 121 is formed at both sides thereof with an inflow part 130 for introducing the reaction gas into the heating unit 100 therethrough and an outflow part 140 for discharging the reaction gas to the outside therethrough, respectively.

The inflow part 130 includes an inflow passageway 131 for introducing the reaction gas into the body 121 therethrough and a cylindrical heat insulating part 132 formed around the outer circumference of the inflow passageway 131 in such a fashion as to be disposed coaxially with the inflow passageway 131. By the same token, the outflow part 140 includes an outflow passageway 141 for discharging the reaction gas to the outside therethrough and a cylindrical heat insulating part 142 formed around the outer circumference of the outflow passageway 141 in such a fashion as to be disposed coaxially with the outflow passageway 141.

By the above arrangement, after the reaction gas has flown through the inflow passageway 131 toward the inside of the heating unit 100, it passes through the communicating hole 122 formed in a first vertical partition 122 and then the communicating hole 126 formed in a first horizontal partition 123 toward the communicating hole 122 formed in a second vertical partition 122 in such a fashion as to be opposite the communicating hole 122 formed in the first vertical partition 122. Resultantly, the flow pattern of the reaction gas forms a serpentine shape within the heating unit 100 while the reaction gas passes through the vertical and horizontal partitions 122 and 123.

In the meantime, the material of the cylindrical body 121 and the partitions 122 and 123 preferably uses quartz which is excellent in heat-resistance and chemical stability.

By the above construction, the heating apparatus can be implemented which has a small-sized dimension while exhibiting a high heating performance.

As described above, the inventive heating apparatus has advantageous effects in that a to-be-heated material, i.e., a reaction gas used in a chemical vapor deposition (CVD) process is pre-heated and the pre-heated reaction gas flows through a flow channel defined by the vertical and horizontal partitions so that the flowing reaction gas is heated by the transfer of heat generated from a hot wire during the flow of the reaction gas, thereby securing heating performance required for a small-sized heating apparatus.

While the present discussion has been described with reference to the particular illustrative embodiments, it is not to be restricted by the embodiments but only by the appended claims. It is to be appreciated that those skilled in the art can change or modify the embodiments without departing from the scope and spirit of the present discussion.

The invention claimed is:

1. A partition-type heating apparatus comprising a heating unit for transferring heat generated from a hot wire to a to-be-heated material, wherein the heating unit including: a heat transfer portion having a cylindrical body, a plurality of vertical partitions arranged inside the cylindrical body in such a fashion as to be vertically spaced apart from one another at regular intervals, and horizontal partitions arranged inside the cylindrical body in such a fashion as to be transversely disposed between the vertical partitions, wherein each of the vertical partitions is formed with a communicating hole for allowing the to-be-heated material to flow therethrough and each of the horizontal partitions is formed with a communicating hole; a cylindrical inflow part mounted at one side of the body for introducing the to-be-heated material into the heating unit therethrough; and a cylindrical outflow part mounted at an opposite side to the inflow part for discharging the reaction gas to the outside therethrough.

2. The partition-type heating apparatus as defined in claim 1, wherein additional horizontal partitions having communicating holes formed therein are transversely disposed below the horizontal partitions in a similar shape to the horizontal partitions in the heating unit.

3. The partition-type heating apparatus as defined in claim 1, wherein the cylindrical inflow part includes a cylindrical inflow passageway for introducing the to-be-heated material into the body therethrough and a cylindrical heat insulating part formed around the outer circumference of the inflow passageway in such a fashion as to be disposed coaxially with the inflow passageway so that the transfer of the heat around the inflow passageway is blocked, and the outflow part includes a cylindrical outflow passageway for discharging the to-be-heated material to the outside therethrough and a cylindrical heat insulating part formed around the outer circumference of the outflow passageway in such a fashion as to be disposed coaxially with the outflow passageway so that the transfer of the heat around the inflow passageway is blocked.

4. The partition-type heating apparatus as defined in claim 3, further comprising: an accommodating portion for receiving the heating unit, wherein the accommodating portion includes a hollow body adapted to allow the inflow part and the outflow part to partially protrude outwardly at both sides thereof, a cooling water tube provided at a peripheral portion of the hollow body to have a certain thickness for allowing cooling water to flow therethrough, and a heat insulating material filled in a space defined between the accommodating portion and the heating unit so as to prevent the heat generated from the heating unit from being discharged to the outside; a controller connected to the heating unit for controlling the temperature of the heating unit; and a power supply portion connected to the hollow body for supplying electric power to the hot wire of the heating unit.

5. The partition-type heating apparatus as defined in claim 4 wherein the to-be-heated material is a reaction gas used in the CVD process.

6. The partition-type heating apparatus as defined in claim 1, wherein the hollow body of the accommodating portion is formed in a cylindrical shape.

7. The partition-type heating apparatus as defined in claim 1 wherein the hollow body of the accommodating portion has a quadrangular section.

8. The partition-type heating apparatus as defined in claim 1 wherein the material of the cylindrical body of the heating unit, and the vertical and horizontal partitions is quartz.

9. The partition-type heating apparatus as defined in claim 2 wherein the material of the cylindrical body of the heating unit, and the vertical and horizontal partitions is quartz.

10. The partition-type heating apparatus as defined in claim 3 wherein the material of the cylindrical body of the heating unit, and the vertical and horizontal partitions is quartz.

11. The partition-type heating apparatus as defined in claim 4 wherein the material of the cylindrical body of the heating unit, and the vertical and horizontal partitions is quartz.

12. The partition-type heating apparatus as defined in claim 5 wherein the material of the cylindrical body of the heating unit, and the vertical and horizontal partitions is quartz.

13. The partition-type heating apparatus as defined in claim 6 wherein the material of the cylindrical body of the heating unit, and the vertical and horizontal partitions is quartz.

14. The partition-type heating apparatus as defined in claim 7 wherein the material of the cylindrical body of the heating unit, and the vertical and horizontal partitions is quartz.

* * * * *